(12) United States Patent
Deslandes

(10) Patent No.: US 9,038,961 B2
(45) Date of Patent: May 26, 2015

(54) METHOD FOR SIMULATING THE MOVEMENT BEHAVIOUR OF A FLUID IN A CLOSED, MOVING CONTAINER

(75) Inventor: Ronald Deslandes, Unterhaching (DE)

(73) Assignee: EADS Deutschland GmbH, Ottobrunn (DE)

( * ) Notice: Subject to any disclaimer, the term of this patent is extended or adjusted under 35 U.S.C. 154(b) by 282 days.

(21) Appl. No.: 13/514,684

(22) PCT Filed: Dec. 9, 2010
(Under 37 CFR 1.47)

(86) PCT No.: PCT/DE2010/001430
§ 371 (c)(1),
(2), (4) Date: Jan. 18, 2013

(87) PCT Pub. No.: WO2011/069491
PCT Pub. Date: Jun. 16, 2011

(65) Prior Publication Data
US 2014/0107859 A1    Apr. 17, 2014

(30) Foreign Application Priority Data
Dec. 11, 2009  (DE) .......................... 10 2009 057 878

(51) Int. Cl.
*B64G 1/00* (2006.01)
*G06F 17/50* (2006.01)

(52) U.S. Cl.
CPC ........ *G06F 17/5009* (2013.01); *G06F 17/5095* (2013.01)

(58) Field of Classification Search
None
See application file for complete search history.

(56) References Cited

U.S. PATENT DOCUMENTS

| | | | | |
|---|---|---|---|---|
| 3,149,601 A * | 9/1964 | Lang | | 114/275 |
| 3,754,601 A * | 8/1973 | Linkewich | | 169/44 |
| 3,901,467 A * | 8/1975 | Hawkshaw | | 244/136 |
| 4,789,170 A * | 12/1988 | Reber | | 280/838 |
| 5,451,016 A * | 9/1995 | Foy et al. | | 244/136 |
| 5,452,869 A * | 9/1995 | Basuthakur et al. | | 244/164 |
| 6,283,412 B1 * | 9/2001 | Mango | | 244/135 R |
| 6,904,708 B2 * | 6/2005 | Rogers | | 37/228 |
| 7,410,130 B2 * | 8/2008 | Wang et al. | | 244/164 |
| 7,506,606 B2 * | 3/2009 | Murphy et al. | | 114/368 |
| 7,580,778 B2 * | 8/2009 | Krishnaswamy et al. | | 701/13 |
| 8,380,473 B2 * | 2/2013 | Falangas | | 703/8 |
| 8,494,697 B2 * | 7/2013 | Ballou et al. | | 701/21 |
| 8,706,460 B2 * | 4/2014 | Falangas | | 703/8 |
| 2002/0079379 A1 * | 6/2002 | Cheung | | 239/171 |
| 2002/0198636 A1 * | 12/2002 | Uenodai et al. | | 701/22 |
| 2004/0074114 A1 * | 4/2004 | Rogers | | 37/228 |
| 2004/0193292 A1 * | 9/2004 | Chiang et al. | | 700/30 |
| 2005/0133671 A1 * | 6/2005 | Wang et al. | | 244/170 |
| 2007/0007021 A1 * | 1/2007 | Regan | | 169/84 |
| 2009/0076669 A1 * | 3/2009 | Krishnaswamy et al. | | 701/4 |
| 2009/0206288 A2 * | 8/2009 | Schiemann | | 251/129.01 |
| 2010/0318336 A1 * | 12/2010 | Falangas | | 703/8 |

(Continued)

OTHER PUBLICATIONS

Corresponding International Search Report with English Translation dated Dec. 23, 2011 ( eight (8) pages).

(Continued)

*Primary Examiner* — Thomas Tarcza
*Assistant Examiner* — Richard Goldman
(74) *Attorney, Agent, or Firm* — Crowell & Moring LLP

(57) ABSTRACT

A method for simulating the movement behavior of a fluid in a closed moving container is provided. The simulation is based on the determination of the potential movement path of the center of gravity of the volume of the fluid as an elliptical trajectory situated in a disturbance plane having certain semi-axes.

6 Claims, 3 Drawing Sheets

(56) References Cited

U.S. PATENT DOCUMENTS

| | | | |
|---|---|---|---|
| 2011/0220003 A1* | 9/2011 | Colmard et al. | 114/74 R |
| 2012/0097088 A1* | 4/2012 | Guerrier | 114/256 |
| 2012/0277940 A1* | 11/2012 | Kumar et al. | 701/20 |
| 2014/0107859 A1* | 4/2014 | Deslandes | 701/1 |
| 2014/0121862 A1* | 5/2014 | Zarrella et al. | 701/3 |

OTHER PUBLICATIONS

Form PCT/ISA/237 (eight (8) pages), Jun. 16, 2011.

Matej Vesenjak et al., "Simulation of Fuel Sloshing—Comparative Study", 3. LS-DYNA Anwenderforum, Bamberg, 2004, pp. G-I-1-G-I-8, XP002665798.

Shahrouz Aliabadi et al., "Comparison of Finite Element and Pendulum Models for Simulation of Sloshing", Computers & Fluids, vol. 32, (2003), pp. 535-545.

A. Baeten et al., "Prediction of Highly Dynamic Airborne Tank Fuel Sloshing and Impact Effects", 46$^{th}$ AIAA Aerospace Sciences Meeting and Exhibit, Jan. 7-10, 2008, American Institute of Aeronautics and Astronautics, pp. 1-15.

Mohamed I. Salem, "Rollover Stability of Partially Filled Heavy-Duty Elliptical Tankers Using Trammel Pendulums to Simulate Fluid Sloshing", Departement of Mechanical and Aerospace Engineering, 2000, (two-hundred and seventy-one (271) pages).

* cited by examiner

METHOD FOR SIMULATING THE MOVEMENT BEHAVIOUR OF A FLUID IN A CLOSED, MOVING CONTAINER

TECHNICAL FIELD

The present invention relates to a method for simulating the movement behavior of a fluid in a closed moving container and transmitting the trajectory data determined therewith to a processing unit arranged downstream thereof. The invention further relates to the use of this method when dropping a load comprising the container from a vehicle.

BACKGROUND OF THE INVENTION

Liquids in containers are not dimensionally stable but react to each container movement with a self-movement. Depending on the filling level of the container, this results in different physical effects which, depending on the movement pattern, can significantly influence the self-movement of the container, in particular in the case when the container itself is being maneuvered, thus is moving.

One such example is a tank of a vehicle (e.g., land vehicles, watercrafts, aircrafts or spacecrafts) filled with a fluid. When the vehicle carries out a rapid movement change, temporally delayed forces of the now moving fluid can be induced back into the vehicle, which forces, in turn, influence the movement of the vehicle itself. It is therefore often helpful and required to be able to foresee the behavior of the fluid in the container during certain movements or movement changes of the vehicle in order to be able, for example, to consider the reactions induced by the fluid on the vehicle when controlling the same.

A particular need for such predictions arises when dropping additional tanks or other loads provided with a liquid container such as, for example, cruise missiles, or motor vehicles airdropped from aircrafts. Also, dropping tanks from a starting rocket or from a spacecraft in space requires being able to predict the self-movement of the liquid still remaining in the tank.

Such predictions can avoid a path change of the dropped tank that results in a collision with the original carrier vehicle, for example, with the aircraft, due to the self-movement. Such predictions have to be carried out as simulations in order to obtain, for example, approvals for aircrafts or approvals for certain airdrop maneuvers. However, they have also to be carried out, for example, to simulate certain dropping procedures for an aircraft so that during the actual operation, no accidents occur such as collisions of the dropped object with the aircraft dropping said object.

It is also helpful to be able to carry out such simulations in adequate airborne computers in order to determine a safe dropping time in a corresponding dropping procedure and to technically allow the airdrop only at that time.

In order to be able to simulate the movement properties of the container partially filled with a fluid, the unsteady physical properties of the fluid in the container must be known. Simulating fluid movements in a container is traditionally carried out on the basis on equations of motion of frictionless and viscous flows. Other calculation approaches use very sophisticated interrelations on the basis of nuclear physics and molecular movements. These methods are very accurate in the appropriate formulation, however, for implementation, they need very large computing capacities in order to obtain a result. Such computing capacities are often not available aboard vehicles and even in the case of an external simulation on the ground, under certain circumstances, they can take several hours or even days.

SUMMARY OF THE INVENTION

Exemplary embodiments of the present invention provide a method for simulating the movement behavior of a fluid in such a manner that the simulation is can be carried out in a fast and simple manner and which delivers an accuracy which is satisfactory in practice in particular for controlling the movement behavior of vehicles.

The inventor has realized that the freedom of movement of a fluid in a container—independent of the shape of the container—can be defined with satisfactory accuracy through a spheroid or ellipsoid. The center of gravity of the fluid always moves along an elliptical path along the surface of the spheroid or the ellipsoid.

The drive for the fluid movement depends on the difference between the inclination angle of the container and the solid angle of the fluid surface. While following the resulting force, the center of gravity of the fluid then reacts with a damped migration of the fluid in the container that is similar to an inclined plane or resembles a pendulum.

In the method for simulating the movement behavior of a fluid according to the present invention, it is initially assumed that the container has a capacity $V_T$ and the fluid has a Volume $V_L$. It is further assumed that a temporally variable or also a constant disturbance affects the container, which disturbance deflects the container from the idle position of the container by an angle $\phi_0$ in a disturbance plane E having a container axis. For this purpose, the following steps are carried out in said method:

a) Determining the potential movement path of the center of gravity (CoG) of the volume ($V_L$) of the fluid as an elliptical trajectory that is situated in the disturbance plane (E) and has the semi-axes $$a = \frac{V_T}{2A} \cdot \left(1 - \frac{V_L}{V_T}\right)$$

$$b = \frac{\sqrt{A}}{2} \cdot \left(1 - \frac{V_L}{V_T}\right)$$

wherein A represents the largest cross-sectional area of the container perpendicular to the disturbance axis (E);

b) determining the trajectory data of the expected disturbance-induced movement of the center of gravity (CoG) as a function of time (t) according to the differential equation:

$$\ddot{\varphi} = \frac{1}{R} \cdot g \cdot \sin\delta - L \cdot \dot{\varphi}$$

which includes
  the excitation: $\phi_0 = \arctan(x_E/z_E)$
  the force of gravity g,
  the tangential angle δ, calculated according to $$\delta = \arctan\left(-\frac{x_E \cdot b^2}{z_E \cdot a^2}\right),$$

wherein $x_E$ and $z_E$ are the coordinates of the center of gravity (CoG) on the elliptical trajectory having the semiaxes a and b;

a fluid-specific damping term L and
the distance R between the center of gravity (CoG) and the center (M) of the elliptical trajectory,
wherein R is calculated according to $$R = \frac{a \cdot b}{\sqrt{a^2 \cdot \sin^2 \bar{\varphi} - b^2 \cdot \cos^2 \bar{\varphi}}} \text{ with } \bar{\varphi} = 90. - \varphi(t)$$

c) determining the expected forces of mass (F) of the fluid, which act in the center of gravity (CoG), as a function of time (t) according to the equation:

$$F = m \cdot g \cdot \cos \delta$$

which includes
the fluid mass m,
the force of gravity g and
the tangential angle $\delta$ in $z_E$ and $z_E$;
d) transmitting the determined trajectory data of the expected disturbance-induced movement (CG) and the expected force of mass (F) acting in the center of gravity (CG) from the first computing unit to a processing unit arranged downstream thereof.

Advantages

Due to the fact that it is assumed in the method according to the invention that the center of gravity of the fluid volume moves on an elliptical path, a very simple and expeditious calculation of the fluid in the container is possible that can be carried out in a very short time and can also be carried out by on-board computers almost in real-time.

Preferably, the method is used if the container is part of a moving device or vehicle, wherein it is particularly advantageous to be used in an aircraft or in a spacecraft. However, it is principally also possible to use this method for predetermining the movement behavior of land vehicles or watercrafts having a container containing a fluid (e.g., a liquid).

It is particularly advantageous if the downstream processing unit comprises a control computer of the moving device or vehicle and if then the expected forces of mass acting through the moving fluid on the container are considered when controlling the moving device or vehicle. For this purpose, the trajectory data and forces of mass determined with the method are transmitted to the control computer of the vehicle. In this manner reactive effects of the fluid sloshing in the tank and acting on the vehicle control are compensated in real-time by the vehicle control because the vehicle control knows time, magnitude and the direction vector of the reactive forces of mass and their chronological sequence already in advance.

For example, it is therefore also possible to influence the tank construction of a vehicle in that, for example, previously provided baffle plates inside the container containing the liquid can be eliminated because the reactive effect of the surge movement of the fluid in the container acting on the vehicle itself can be compensated by the control, or can be specifically considered when controlling the vehicle, for example, to support said control.

Another particularly advantageous use of the method according to the invention is in connection with vehicles that drop a load comprising a container filled with liquid. The container here is a load, preferably an additional tank or a portion thereof, that can be dropped from a vehicle. The downstream processing unit comprises an on-board computer of the vehicle. The vehicle is preferably formed here by an aircraft. The latter can be a combat aircraft that drops an additional tank or a cruise missile having a tank filled with liquid, or it can be a cargo plane that airdrops vehicles or other loads which, in turn, comprise a container filled with fluid. In this preferred refinement of the method according to the invention, the forces of mass to be expected that act through the moving fluid on the container are considered when determining permissible dropping conditions for the load to be dropped. For this purpose, the trajectory data of the disturbance-induced movement of the center of gravity of the fluid in the container determined during the performance of the method, and the data of the expected forces of mass acting on the center of gravity are transmitted to the on-board computer of the vehicle.

Under consideration of the actual trajectory data, the on-board computer can then make a decision if dropping the load at a certain time is permissible and, if applicable, can authorize the airdrop. However, the on-board computer can also suggest an adequate movement procedure for the vehicle to the vehicle operator, which allows dropping the load safely.

For this, a separation simulation for the droppable load can be carried out in the downstream processing unit, in which simulation the forces of mass acting through the moving fluid on the container are calculated for determining a permissible dropping condition for the droppable load. This can take place during the flight or can be carried out on the ground, independent of an actual flight and an actual dropping operation, in order to demonstrate and obtain the permission for the flight of the aircraft and the involved equipment such as, for example, the droppable loads.

Carrying out simulations with the method according to the invention allows in addition to use the dynamic data obtained therefrom for optimizing the design of fluid-containing containers and also to optimize the spectra of use of vehicles or droppable loads provided with such containers.

Exemplary embodiments of the present invention are also directed to a computer program having program code means in order to carry out all steps of the method according to the invention when the program runs on a computer.

Furthermore, exemplary embodiments of the present invention are directed to a computer program product having program code stored on a computer-readable medium in order to carry out the method according to the invention when the program runs on a computer.

Preferred exemplary embodiments of the invention with additional configuration details and further advantages are described and explained in more detail hereinafter with reference to the attached drawings.

DETAILED DESCRIPTION OF THE INVENTION

Figure 1:
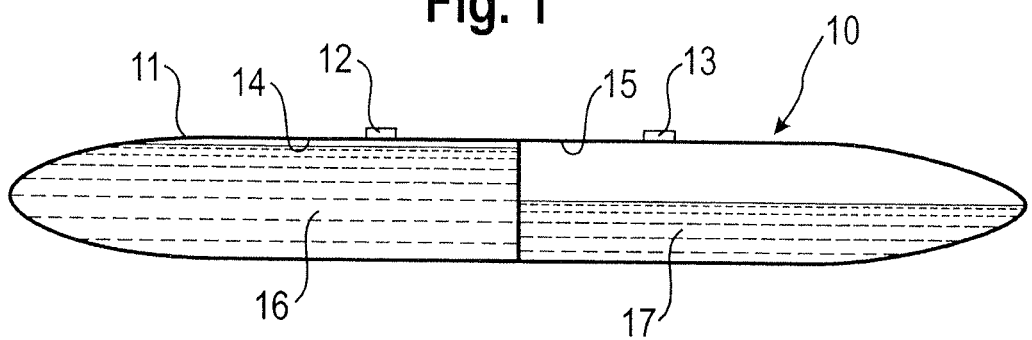
FIG. 1 shows a schematic longitudinal sectional view through an additional tank of an aircraft.

FIG. 1 shows a longitudinal sectional view of an additional tank 10 of an aircraft 1. The additional tank 10 has an outer shell 11 on the upper side of which two holders 12, 13 are provided by means of which the additional tank can be detachably secured in a generally known manner on the aircraft 1.

The additional tank 10 has a front tank chamber 14 and a rear tank chamber 15 each of which form a first and a second container for a fluid. In the present case, the fluid is liquid fuel. In the example shown in FIG. 1, the front tank chamber 14 is almost completely filled with a fluid 16 whereas the rear tank chamber 15 is only approximately half-filled with a fluid 17.

Figure 2:
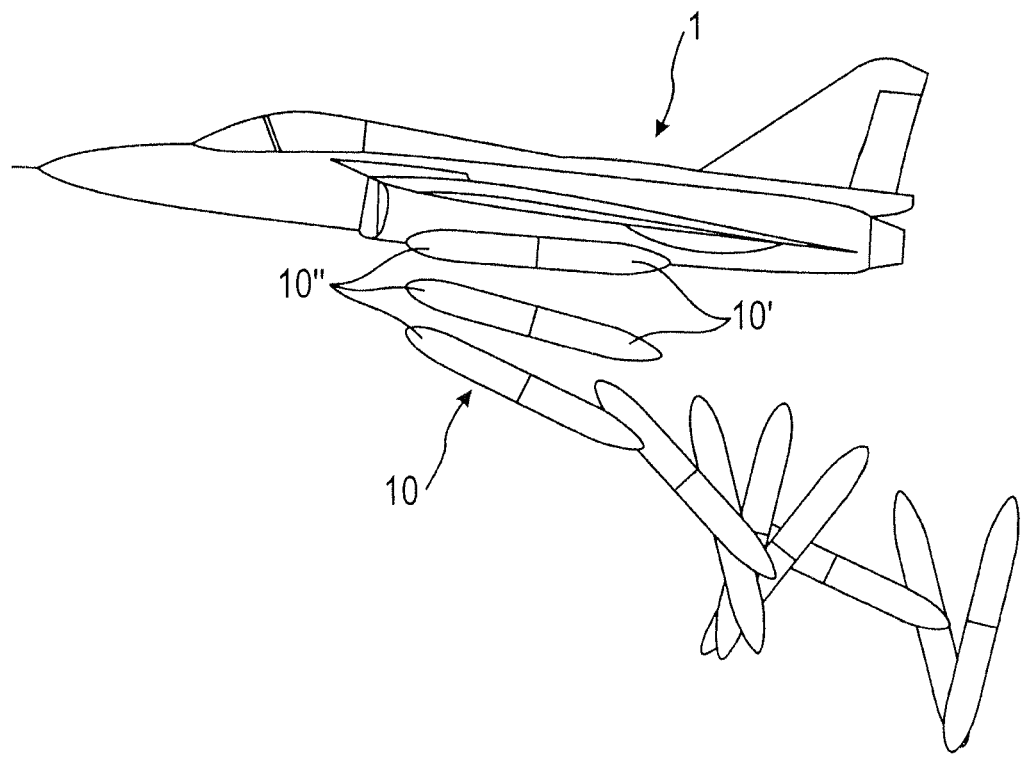
FIG. 2 shows an illustration of the separation behavior of an additional tank after being dropped from an aircraft.

FIG. 2 shows the chronological sequence of the movement phases of an additional tank 10 dropped from the aircraft 1. The movement example shows that after disengaging from the aircraft 1, the additional tank 10 rotates about its transverse axis in that the tail 10' of the additional tank 10 sinks faster than the bow 10". At the same time, the additional tank also carries out a rotation (not shown in the illustration) about an axis parallel to the movement axis of the aircraft.

FIG. 2 clearly shows that after decoupling from the aircraft, the additional tank 10 still moves for a certain time with the same speed before it is decelerated due to aerodynamic resistances, and falls back with respect to the aircraft 1. In particular in the phase shortly after detaching the additional tank, when the latter is still beneath the wing of the aircraft, it is possible in the case of a disadvantageous residual fuel volume in the tank that a movement occurs which differs from the ideal separation movement of the additional tank 10 illustrated in FIG. 2 and which is induced by the self-movement of the fuel in the tank. In a very disadvantageous case, this can result in a collision of the bow 10" or the tail 10' of the additional tanks 10 with the wing of the aircraft 1. However, such a collision is to be reliably avoided.

In order to avoid such an undesirable collision of the additional tank 10 with the aircraft 1, the behavior to be expected of the additional tank after disengaging from the aircraft 1 has to be projected, thus simulated, with the actual movement data of the aircraft, the movement data of the additional tank detached from the aircraft, the geometric and aerodynamic parameters of the aircraft and the additional tank, and the information on the filling level of the additional tank.

Figure 3:
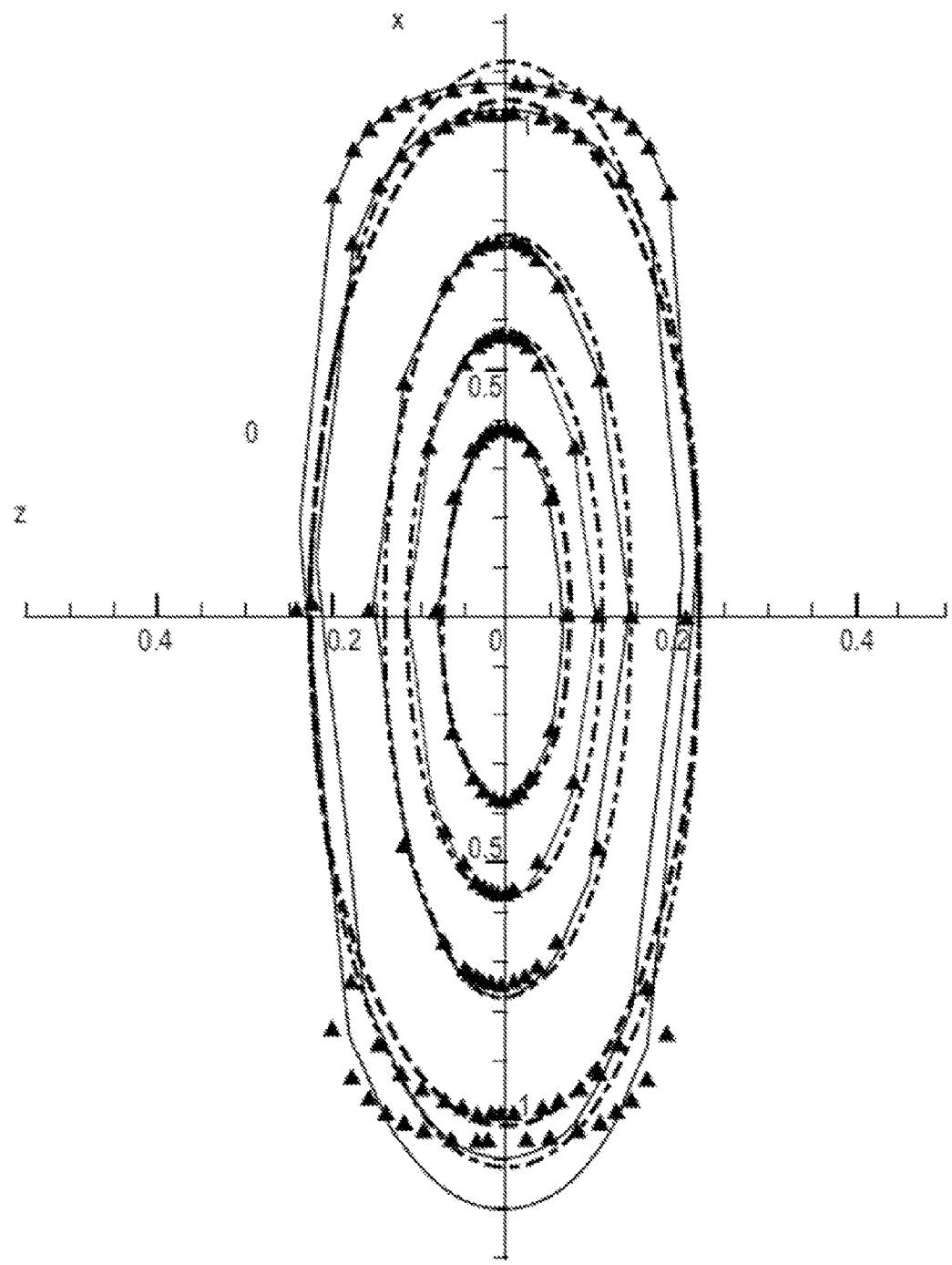
FIG. 3 shows an array of ellipses which illustrates the different positions of centers of gravity of the fluid in a model-like manner.

The inventor has found that that the movement path of the center of gravity of a fluid moving in a container can be approximately represented as an ellipse. FIG. 3 shows an array of numerically determined positions of the centers of gravity for a fluid in a cylindrical container. The individual determined positions of the centers of gravity are illustrated as triangles. Correspondingly associated ellipses are illustrated as dot-dashed lines. The outermost, largest ellipse relates to a filling level of the container of 5%, that is, the ratio of the fluid volume $V_L$ to the capacity $V_T$ of the container is 5%. The next inner ellipse describes already a filling level of 10%. With the container being filled 100%, the ellipse is reduced to the intersection of the two axes.

It is apparent from FIG. 3 that at a filling level of already 10%, the approximation of the numerically determined positions of the centers of gravity for the different filling states in the plane through corresponding ellipses, in the present case through ellipsoids when viewed three-dimensionally for a cylindrical tank cell, has an approximation error of well below 2%.

With this elliptical equivalence, the calculation of all filling states of the container of a tank, thus of its respective wet cell, at any inclination angle, can be reduced to the determination of the semi-axes of the corresponding equivalent ellipse (or equivalent ellipsoid). Each ellipse forms the locus of all positions of the centers of gravity of the fluid which can arise as a result of the container's positions at possible inclination angles.

These equivalent ellipses can be calculated in a generally known manner with regard to their semi-axes as follows:

semi-major axis:

$$a = \frac{V_T}{2 \cdot A} \cdot \left(1 - \frac{V_L}{V_T}\right)$$

as general formula, or
specifically for a cylindrical cross-section of the tank or the tank chamber according to the formula $$a_{zyl} = \frac{2 \cdot V_T}{D^2 \cdot \pi} \cdot \left(1 - \frac{V_L}{V_T}\right)$$

semi-minor axis:

$$b = \frac{\sqrt{A}}{2} \cdot \left(1 - \frac{V_L}{V_T}\right)$$

as general formula, or specifically for a cylindrical cross-section of the tank or tank chamber according to the formula:

$$b = \frac{D \cdot \sqrt{\pi}}{4} \cdot \left(1 - \frac{V_L}{V_T}\right)$$

with A being the cross-sectional area of the tank or the tank chamber; with D being the diameter of the tank or the tank chamber, and with $$\frac{V_L}{V_T}$$

being the filling level of the container, thus the tank or the tank chamber, wherein $V_L$ represents the volume of the fluid and $V_T$ represents the capacity of the container.

If a sudden external disturbance, for example a disturbance of the angle of attack of the magnitude $\phi_0$, acts on the additional tank 10 shown in FIG. 1 and therefore on the fluid resting therein such as, for example, the fuel, wherein the tank previously was in the state of equilibrium, the tank will respond with a "sloshing movement" which corresponds to a movement of the center of gravity on the surface of the associated equivalent ellipsoid. As an example, a pure disturbance of the angle of attack is considered here, thus an acceleration impulse which acts in a vertical plane on the container.

Figure 4:
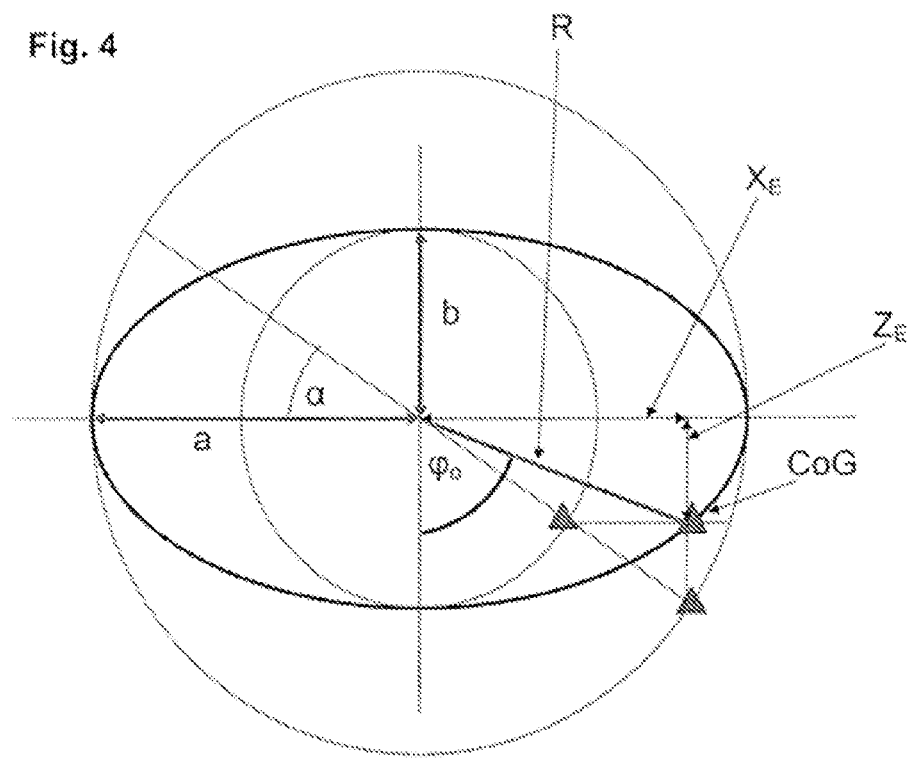
FIG. 4 shows an illustration of the geometric relationships of the simulation method according to the invention.

The movement of the center of gravity CoG of the fluid on the path of the associated ellipse in this disturbance plane E is described with reference to the illustration of the geometrical relationships shown in FIG. 4 according to the following equation:

$$\ddot{\varphi} = \frac{1}{R} \cdot g \cdot \sin\delta - L \cdot \dot{\varphi}$$

which includes
the excitation:

$$\varphi_0 = \arctan\left(\frac{x_E}{z_E}\right)$$

the force of gravity g,
the tangential angle δ, calculated according to $$\delta = \arctan\left(-\frac{x_E \cdot b^2}{z_E \cdot a^2}\right),$$

wherein $z_E$ and $z_E$ are the coordinates of the center of gravity (CoG) on the elliptical trajectory having the semi-axes a and b;
a fluid-specific damping term L, and
the distance R between the center of gravity (CoG) and the center (M) of the elliptical trajectory,
wherein R is calculated according to $$R = \frac{a \cdot b}{\sqrt{a^2 \cdot \sin^2\overline{\varphi} - b^2 \cdot \cos^2\overline{\varphi}}} \text{ with } \overline{\varphi} = 90° - \varphi(t)$$

Here, L is a damping term which represents the viscosity influence of the moving fluid. Said damping term L can be determined experimentally; for kerosene, this damping term is in a range of 0.1 to 0.25.

Figure 5:
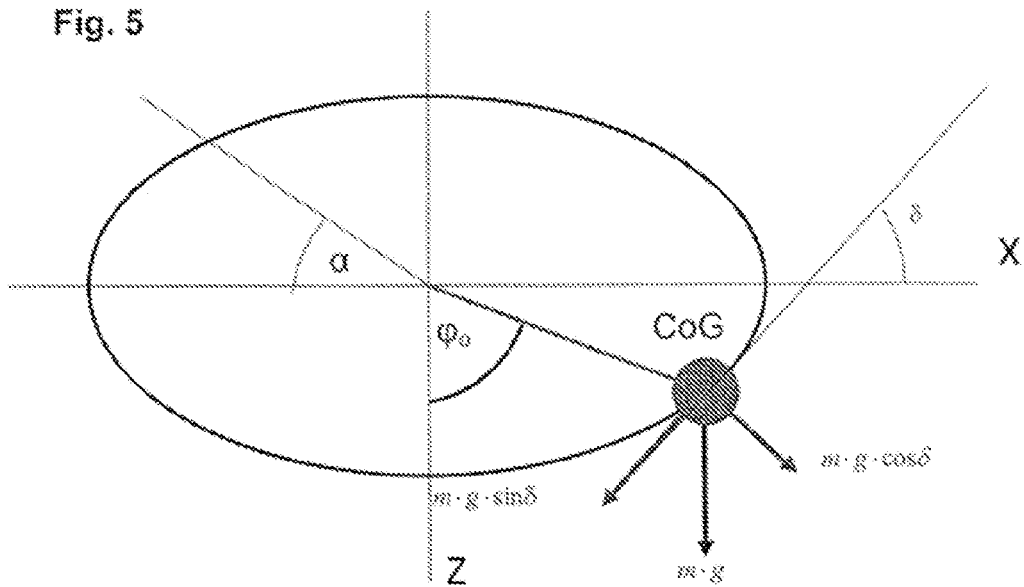
FIG. 5 shows an illustration of the forces of mass acting in the center of gravity.

Through the numerical solution of the differential equation, time step by time step, the movement of the center of gravity CoG can be illustrated on the ellipse. The position of the center of gravity and the moments of inertia as well as the fluid stylus force can now be calculated non-stationarily. The effective fluid stylus force which acts from the fluid onto the wall 11 of the container 10 is calculated from the following formula:

$$F = m \cdot g \cdot \cos\delta$$

which includes
the fluid mass m,
the force of gravity g
the tangential angle δ at the location with the coordinates $x_E$ and $z_E$ (FIG. 5).

These non-stationary portions represent important interactive information that can be used as inputs for the control system and for simulations of highly complex movement sequences. For example, the separation behavior of an external additional fuel tank of an aircraft can be calculated in this manner.

When reference is made in this description and in the claims to fluid or liquid, this is to be understood only as an example. The inventive method can also be applied to other flowing substances such as, for example, fluidized fillings of solids.

Reference numbers in the claims, the description and in the drawings serve merely for a better understanding of the invention and shall not limit the scope of protection.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

REFERENCE LIST

1 Aircraft
10 Additional tank
10' Tail of the additional tank
10" Bow of the additional tank
12 Holder
13 Holder
14 Front tank chamber
15 Rear tank chamber
16 Fluid
17 Fluid
CoG Movement of the center of gravity

The invention claimed is:

1. A method for controlling a vehicle comprising a closed container with a fluid, the container having a capacity ($V_T$) and the fluid having a volume ($V_L$), the method comprising the steps:
determining, using a simulation in a computing unit, a movement behavior of the fluid as a reaction to a planned movement change of the vehicle by determining, independent of a shape of the container, a potential movement path of a center of gravity of the volume ($V_L$) of the fluid as an elliptical trajectory;
determining expected trajectory data and forces of mass that will act on the container caused by the movement behavior of the fluid due to the planned movement change;
transmitting the expected forces of mass to a control computer of the vehicle; and
compensating, in real-time, for reactive effects on control of the vehicle induced by the expected forces of mass.

2. The method according to the claim 1,
wherein the elliptical trajectory is situated in a disturbance plane (E) and has the semi-axes $$a = \frac{V_T}{2A} \cdot \left(1 - \frac{V_L}{V_T}\right)$$

$$b = \frac{\sqrt{A}}{2} \cdot \left(1 - \frac{V_L}{V_T}\right)$$

wherein (A) represents the largest cross-sectional area of the container perpendicular to the disturbance axis (E);
wherein the simulation of the movement behavior of the fluid in the container, with a temporally variable constant disturbance acting as a movement change on the container, which disturbance deflects the container from an idle position by an angle ($\phi_0$) situated in the disturbance plane (E) having a container axis, involves the computing unit performing the further steps of
a) determining trajectory data of the expected disturbance-induced movement of the center of gravity as a function of time (t) according to the differential equation:

$$\ddot{\varphi} = \frac{1}{R} \cdot g \cdot \sin\delta - L \cdot \dot{\varphi}$$

which includes
the excitation:

$$\varphi_0 = \arctan\left(\frac{x_E}{z_E}\right) \qquad 5$$

the force of gravity (g),
the tangential angle (δ) calculated according to $$\delta = \arctan\left(-\frac{x_E \cdot b^2}{z_E \cdot a^2}\right),$$

wherein ($x_E$) and ($z_E$) are coordinates of the center of gravity on the elliptical trajectory having semi-axes (a) and (b);
a fluid-specific damping term (L) and
the distance (R) between the center of gravity and the center (M) of the elliptical trajectory,
wherein (R) is calculated according to $$R = \frac{a \cdot b}{\sqrt{a^2 \cdot \sin^2\overline{\varphi} - b^2 \cdot \cos^2\overline{\varphi}}} \quad \text{with } \overline{\varphi} = 90° - \varphi(t)$$

b) determining expected forces of mass (F) of the fluid, which act in the center of gravity, as a function of time (t) according to the equation:

$$F = m \cdot g \cdot \cos \delta$$

which includes
the fluid mass (m),
the force of gravity (g) and
the tangential angle (δ) in ($x_E$) and ($z_E$);
c) transmitting the determined trajectory data of the expected disturbance-induced movement and the expected force of mass (F) acting in the center of gravity from the computing unit to the processing unit arranged downstream thereof.

3. A method for dropping a load from vehicle, the load having a closed container with a fluid, the container having a capacity ($V_T$) and the fluid having a volume ($V_L$), the method comprising the steps:
determining, using a simulation in a computing unit, a movement behavior of the fluid as a reaction to a drop of the load from the vehicle by determining, independent of a shape of the container, a potential movement path of a center of gravity of the volume ($V_L$) of the fluid as an elliptical trajectory;
determining expected trajectory data and forces of mass that will act on the container caused by movement of the fluid when dropping the load;
transmitting the expected trajectory data and forces of mass to an on-board computer of the vehicle;
determining, using the on-board computer and accounting for an actual trajectory data of the movement path of the vehicle, whether dropping the load is permissible and authorized; and
dropping the load when it is determined that dropping is permissible and authorized.

4. The method according to the claim 3,
wherein the elliptical trajectory is situated in a disturbance plane (E) and has the semi-axes $$a = \frac{V_T}{2A} \cdot \left(1 - \frac{V_L}{V_T}\right)$$

$$b = \frac{\sqrt{A}}{2} \cdot \left(1 - \frac{V_L}{V_T}\right)$$

wherein (A) represents the largest cross-sectional area of the container perpendicular to the disturbance axis (E);
wherein the simulation of the movement behavior of the fluid in the container, with a temporally variable constant disturbance acting as a movement change on the container, which disturbance deflects the container from an idle position by an angle ($\phi_0$) situated in the disturbance plane (E) having a container axis, involves the computing unit performing the further steps of
a) determining trajectory data of the expected disturbance-induced movement of the center of gravity as a function of time (t) according to the differential equation:

$$\ddot{\varphi} = \frac{1}{R} \cdot g \cdot \sin\delta - L \cdot \dot{\varphi}$$

which includes
the excitation:

$$\varphi_0 = \arctan\left(\frac{x_E}{z_E}\right)$$

the force of gravity (g),
the tangential angle (δ) calculated according to $$\delta = \arctan\left(-\frac{x_E \cdot b^2}{z_E \cdot a^2}\right),$$

wherein ($x_E$) and ($z_E$) are coordinates of the center of gravity on the elliptical trajectory having semi-axes (a) and (b);
a fluid-specific damping term (L) and
the distance (R) between the center of gravity and the center (M) of the elliptical trajectory,
wherein (R) is calculated according to $$R = \frac{a \cdot b}{\sqrt{a^2 \cdot \sin^2\overline{\varphi} - b^2 \cdot \cos^2\overline{\varphi}}} \quad \text{with } \overline{\varphi} = 90° - \varphi(t)$$

b) determining expected forces of mass (F) of the fluid, which act in the center of gravity, as a function of time (t) according to the equation:

$$F = m \cdot g \cdot \cos \delta$$

which includes
the fluid mass (m),
the force of gravity (g) and
the tangential angle (δ) in ($x_E$) and ($z_E$);
c) transmitting the determined trajectory data of the expected disturbance-induced movement and the expected force of mass (F) acting in the center of gravity from the computing unit to the processing unit arranged downstream thereof.

5. A method for dropping a load from an vehicle, the load having a closed container with a fluid, the container having a capacity ($V_T$) and the fluid having a volume ($V_L$), the method comprising the steps:

determining, using a simulation in a computing unit, a movement behavior of the fluid as a reaction to a drop of the load from the vehicle by determining, independent of a shape of the container, a potential movement path of a center of gravity of the volume ($V_L$) of the fluid as an elliptical trajectory;

determining expected trajectory data and forces of mass that will act on the container caused by movement of the fluid when dropping the load;

transmitting the expected trajectory data and forces of mass an on-board computer of the vehicle; and generating, using the on-board computer, a suggested movement procedure of the vehicle to allow a safe drop of the load; and executing the suggested movement procedure while dropping the load.

6. The method according to the claims 5, the elliptical trajectory is situated in a disturbance plane (E) and has the semi-axes $$a = \frac{V_T}{2A} \cdot \left(1 - \frac{V_L}{V_T}\right)$$

$$b = \frac{\sqrt{A}}{2} \cdot \left(1 - \frac{V_L}{V_T}\right)$$

wherein (A) represents the largest cross-sectional area of the container perpendicular to the disturbance axis (E);

wherein the simulation of the movement behavior of the fluid in the container, with a temporally variable constant disturbance acting as a movement change on the container, which disturbance deflects the container from an idle position by an angle ($\phi_0$) situated in the disturbance plane (E) having a container axis, involves the computing unit performing the further steps of a) determining trajectory data of the expected disturbance-induced movement of the center of gravity as a function of time (t) according to the differential equation:

$$\ddot{\varphi} = \frac{1}{R} \cdot g \cdot \sin\delta - L \cdot \dot{\varphi}$$

which includes
the excitation:

$$\varphi_0 = \arctan\left(\frac{x_E}{z_E}\right)$$

the force of gravity (g),
the tangential angle ($\delta$), calculated according to $$\delta = \arctan\left(-\frac{x_E \cdot b^2}{z_E \cdot a^2}\right),$$

wherein ($x_E$) and ($z_E$) are coordinates of the center of gravity on the elliptical trajectory having semi-axes (a) and (b);
a fluid-specific damping term (L) and
the distance (R) between the center of gravity and the center (M) of the elliptical trajectory,
wherein (R) is calculated according to $$R = \frac{a \cdot b}{\sqrt{a^2 \cdot \sin^2\overline{\varphi} - b^2 \cdot \cos^2\overline{\varphi}}} \text{ with } \overline{\varphi} = 90° - \varphi(t)$$

b) determining expected forces of mass (F) of the fluid, which act in the center of gravity, as a function of time (t) according to the equation:

$F = m \cdot g \cdot \cos \delta$ which includes
the fluid mass (m),
the force of gravity (g) and
the tangential angle ($\delta$) in ($x_E$) and ($z_E$);

c) transmitting the determined trajectory data of the expected disturbance-induced movement and the expected force of mass (F) acting in the center of gravity from the computing unit to the processing unit arranged downstream thereof.

* * * * *